United States Patent [19]

Kinoshita

[11] Patent Number: 5,059,919
[45] Date of Patent: Oct. 22, 1991

[54] AMPLIFYING APPARATUS WITH A DIFFERENTIAL AMPLIFIER STAGE

[75] Inventor: Hitoshi Kinoshita, Kawasaki, Japan

[73] Assignee: Kabushiki Kaisha Toshiba, Japan

[21] Appl. No.: 530,619

[22] Filed: May 30, 1990

[30] Foreign Application Priority Data

May 31, 1989 [JP] Japan .................................. 1-138921

[51] Int. Cl.$^5$ ............................................. H03H 3/45
[52] U.S. Cl. ..................................... 330/51; 330/260
[58] Field of Search ................. 330/51, 149, 252, 260;
381/94, 121

[56] References Cited

U.S. PATENT DOCUMENTS 4,853,648 8/1989 Imanishi ........................... 330/51 X Primary Examiner—James B. Mullins
Attorney, Agent, or Firm—Banner, Birch, McKie & Beckett

[57] ABSTRACT

An amplifying device comprises a differential amplifier stage, which includes a first transistor supplied with an input signal and a second transistor supplied with an output signal as a negative feedback signal, and a third transistor for detecting cutoff of a power supply voltage to be supplied to the differential amplifier stage. The third transistor controls a fourth transistor which sets the potential at the base of the first transistor at the ground level. The base of the first transistor is connected to the base of a fifth transistor, which controls a sixth transistor connected between the ground and the base of the second transistor so that in a power-off state, the fourth and sixth transistors render the potentials at the bases of the first and second transistors to be the ground level.

9 Claims, 1 Drawing Sheet

AMPLIFYING APPARATUS WITH A DIFFERENTIAL AMPLIFIER STAGE

BACKGROUND OF THE INVENTION

1. Field of the Invention

The present invention generally relates to an amplifying apparatus with a differential amplifier stage located at the input stage. More particularly, this invention is directed to an amplifying apparatus suitable for a low frequency signal, which reduces shock noise that occurs when a power supply is switched on or off.

2. Description of the Related Art

For instance, an amplifying apparatus for amplifying a sound signal should meet severe requirements against shock noise that is generated in accordance with the ON/OFF action of the power supply. Particularly, regarding a power amplifying apparatus for driving loud speakers according to an output signal from the mentioned amplifier apparatus, there is a demand for an ability to suppress undesirable shock noise which i generated from loudspeakers when the power supply is switched on or off.

There is known means for suppressing such shock noise; this means uses a decoupling capacitor or ripple filter capacitor connected to a power circuit, and utilizes a time constant set by a circuit including such a capacitor to mute a sound signal output.

FIG. 3 exemplifies a conventional amplifying apparatus which suppresses shock noise caused according to the ON/OFF action of a power supply. A capacitor 11 and resistors 12, 13 and 14 constitute a ripple filter circuit. A power supply voltage $V_{CC}$ is divided by the resistors 12 and 13, connected in series, and the divided voltage is supplied via the resistor 14 to the capacitor 11.

The voltage $V_{CC}$ is further divided by resistors 15 and 16, and the divided voltage is supplied to the bases of transistors 17 and 18 whose emitters are supplied via the resistors 12 and 14 with the voltage $V_{CC}$. The ratio of the resistances of the resistors 15 and 16 is so set that the base potential of the transistors 17 and 18 is equal to or higher than their emitter potential. That is, the transistors 17 and 18 are set off in the normal operational state.

The transistor 17 thus controlled has its collector connected to the base of a transistor 19, which is connected in parallel to the capacitor 11, so that the transistor 17 when on sets the transistor 19 on to thereby discharge the capacitor 11. A signal from the collector of the transistor 18 is supplied to the base of the transistor 20, so that an output signal is output in the normal state where the former transistor 18 is rendered on.

In other words, in the normal operational state where the power supply voltage $V_{CC}$ is set, the transistor 17 is rendered off, so is the transistor 19, thus permitting the capacitor 11 to be charged by the voltage $V_{CC}$ via the resistors 12 and 14. As the transistor 18 is off, the transistor 20 is rendered off and an output signal is properly output.

When the power supply is switched off in such a state, the voltage $V_{CC}$ falls and the base potential of the transistors 17 and 18 becomes lower than their emitter potential before the voltage of the ripple filter circuit falls. This renders the transistors 17 and 18 operative, which turns on the transistors 19 and 20. The transistor 19 being on permits the capacitor 11 to be discharged. At the same time, the output signal is led to the ground by the transistor 20 to cut off the output, thereby preventing shock noise from being generated by the power off of the power supply.

The use of the above-described circuit is effective in suppressing shock noise which is generated in accordance with the OFF operation of a single power supply, but cannot cope with a case where the ON/OFF operation of the power supply is sequentially repeated. When such an amplifier circuit is constituted by an integrated circuit, a differential amplifier circuit is provided at the input stage though not shown in FIG. 3. Such a differential amplifier circuit often has different time constants on one input side which is supplied with an input signal and the other input side which is supplied with an output signal as a negative feedback signal and this circuit is in an unbalanced state. When the power supply is switched off, switched on again, then switched off again, therefore, the unbalanced state of this differential circuit would directly appear as a variation in the output and would be output as shock noise.

For instance, in an amplifier circuit provided in a stereo system for an automobile, when a starter motor is operated to start the engine through operation of an ignition key, the power for the stereo system is cut off for a very short period of time, in which case, particularly, the generation of the aforementioned shock noise should be considered.

SUMMARY OF THE INVENTION

Accordingly, it is an object of the present invention to provide an amplifying apparatus with a differential amplifier stage, which can effectively suppress generation of shock noise originating from an ON/OFF control of a power supply, particularly originating from the OFF operation of the power supply, so as to prevent the adverse influence of the shock noise from appearing on the output.

It is another object of this invention to provide an amplifying apparatus which can effectively prevent generation of shock noise originating particularly from the power-off operation following the second one in a case where the ON/OFF operation of the power supply is repeated.

It is a further object of this invention to provide an amplifying apparatus with a differential amplifier stage, which can surely suppress unpleasant shock noise to provide good sound outputs, when applied even to an audio apparatus that is installed in an automobile and has its power supply frequently switched on and off.

The amplifying apparatus with a differential amplifier stage according to this invention comprises poweroff detecting means for detecting the stop of an amplifying operation caused by switching a power supply off, first input control means for inhibiting an input to a differential amplifier circuit in accordance with power-off detection by the power-off detecting means, differential input detecting means for detecting an input to the differential amplifier circuit, and second input control means for inhibiting an input to a negative feedback side of the differential amplifier circuit when the differential input detecting means detects a reduction in the input.

In the thus constituted amplifying apparatus having the differential amplifier stage, the power-off detecting means detects the power-off of the power supply and the first input control means inhibits an input to the differential amplifier stage. At the same time, the differential input detecting means detects the falling of the input signal and causes the second input control means to inhibit a negative feedback input to the differential input stage. When the power supply is switched off, therefore, the input signal as well as the negative feedback input are inhibited from being input to the differential input stage. The unbalanced state of the differential amplifier stage is therefore corrected quickly with the power-off action of the power supply, thus effective suppressing shock noise originating from an amplified output even when the power supply is sequentially subjected to an ON/OFF control.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawing, which is incorporated in and constitutes a part of the specification, illustrates presently preferred embodiments of the invention and, together with the general description given above and the detailed description of the preferred embodiments given below, serves to explain the principles of the invention.

DETAILED DESCRIPTION OF THE PREFERRED EMBODIMENTS

Preferred embodiments of this invention will now be described referring to the accompanying drawings.

Figure 1:
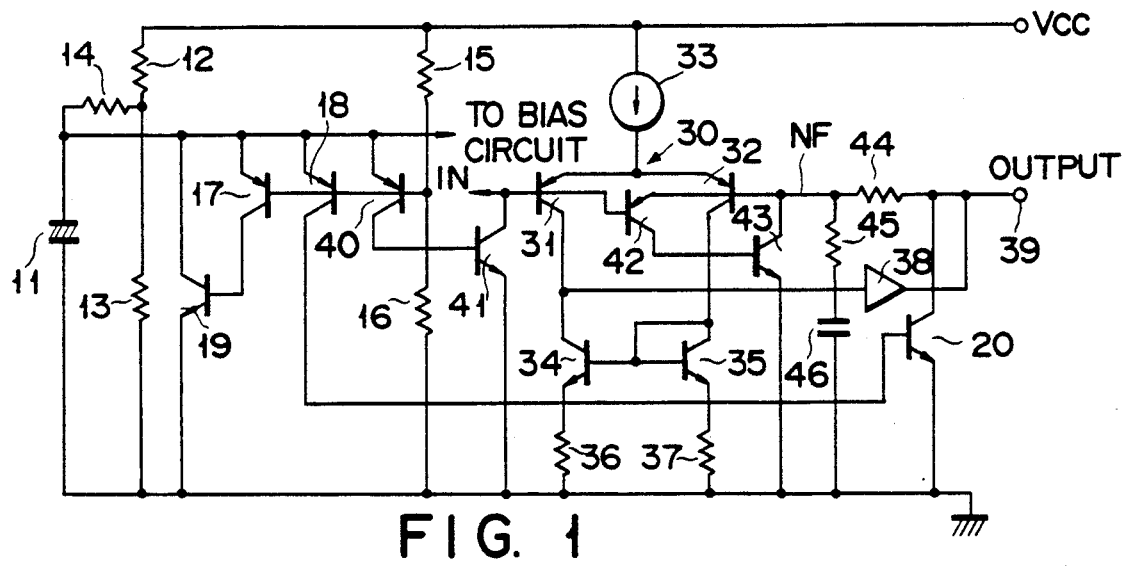
FIG. 1 is a circuit diagram for explaining the first embodiment of an amplifying apparatus of the present invention.

FIG. 1 presents a low frequency amplifying apparatus with a differential amplifier stage 30, which amplifies a sound signal. The differential amplifier stage 30, which comprises a pair of PNP transistors 31 and 32, performs a differential operation. The transistors 31 and 32 have their emitters supplied with a power supply voltage $V_{CC}$ through a constant current circuit 33, and their collectors connected to the collectors of NPN transistors 34 and 35 which constitute a current mirror circuit. The transistors 34 and 35 have their emitters grounded through resistors 36 and 37, and their bases connected together to the collector of the transistor 35. An output signal from the collector of the transistor 34 is amplified by an amplifier 38 as needed, and supplied to an output terminal 39.

Figure 3:
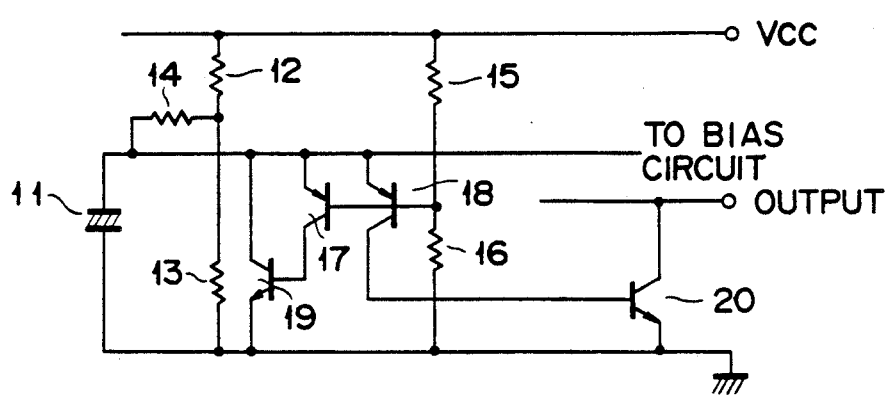
FIG. 3 is a circuit diagram exemplifying a shock noise preventing circuit applied to a conventional amplifying apparatus in order to avoid shock noises.

This amplifying apparatus has the same circuit as the one shown in FIG. 3 for suppressing shock noises; the same reference numerals as given in FIG. 3 are used to specify the corresponding or identical elements. A capacitor 11, which is connected in parallel to a transistor 19, is always charged by the voltage $V_{CC}$ via resistors 12 and 14. The voltage $V_{CC}$ is divided by resistors 15 and 16, and transistors 17 and 18 are controlled with the divided voltage. The emitters of the transistors 17 and 18 are connected, together with the collector of a transistor 19, to a bias circuit (not shown). When the power supply voltage falls, the transistors 17 and 18 are rendered on. The transistor 17 turns on the transistor 19 to discharge the capacitor 11, while the transistor 18 turns on a transistor 20, thus preventing shock noise from being output when the voltage $V_{CC}$ is turned off.

The node between the resistors 15 and 16 is connected to the base of a PNP transistor 40. This transistor 40 has its emitter connected via the resistors 12 and 14 to the voltage $V_{CC}$, and its collector connected to the base of an NPN transistor 41. When the voltage $V_{CC}$ is in the normal state, the transistor 40 is rendered off together with the transistors 17 and 18. When the voltage $V_{CC}$ is off, the transistor 40 is rendered on. In other words, this transistor 40 constitutes means of detecting the of the power supply voltage. When the transistor 40 is turned on, the transistor 41 is turned on accordingly.

The transistor 41 is connected between the ground and the base of the transistor 31 on the input side, one element of the differential amplifier stage 30. When the transistor 41 is turned on, the input signal is grounded, and the level of an input signal to the differential amplifier stage 30 is reduced to the ground level. That is, the transistor 41 constitutes the first input control means for the differential amplifier stage 30.

The input signal of the transistor 31 is further sent to the base of a PNP transistor 42. The transistor 42 has its emitter supplied with a signal that is supplied to the base of the transistor 32, and its collector connected to the base of a transistor 43. In other words, when the level of the input signal to the differential amplifier stage 30 decreases, the transistor 42 is turned on, and it constitutes differential input detecting means which is controlled according to the status of the differential input. When the transistor 42 is turned on, the transistor 43 is rendered on.

The transistor 32, another element of the differential amplifier stage 30, has its base supplied with a signal for negative feedback (NF) from the output terminal 39 as a negative feedback signal through a feedback resistor 44. The transistor 43 has its collector connected to the base of the transistor 32, and its emitter grounded. In other words, the transistor 43 when on causes the base of the transistor 32 to have a ground potential, and constitutes the second input control means on the NF side. The base of the transistor 32 is further grounded via a feedback resistor 45 and an NF coupling capacitor 46.

When the voltage $V_{CC}$ is turned off in the thus constituted circuit, the transistor 19 is turned on by the transistor 17 so as to discharge the capacitor 11, and the transistor 20 is turned on by the transistor 18 so as to mute the output.

Further, the transistor 40 is turned on together with the transistors 17 and 18, so that the transistor 41 is turned on to thereby drastically decrease the level of an input signal IN of the input differential amplifier stage 30.

On the NF side of the differential amplifier stage 30, however, the potential does not sharply decrease because of the presence of a coupling capacitor 46. However, if the potential on the side of the input IN of the differential amplifier stage 30 drastically drops by the transistor 41, the transistor 42 is turned on to render the transistor 43 on. The transistor 43 coupling capacitor 46 is then rapidly discharged by the transistor 43, which rapidly decreases the levels of the signals on both the input signal and the NF input side of the input differential amplifier stage 30. Therefore, the unbalanced state after the power supply is switched off is quickly relieved. Even if the power supply is sequentially turned on and off, the differential amplifier stage 30 can surely prevent the shock noise originating from the power-off operation from being output.

Figure 2:
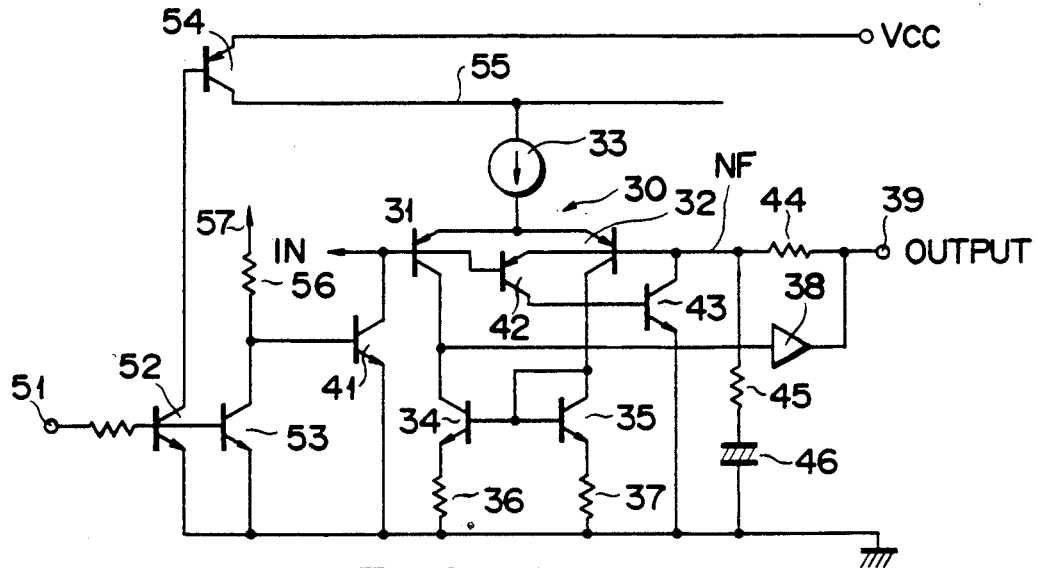
FIG. 2 is a circuit diagram exemplifying the second embodiment of the present invention as applied to a stand-by circuit.

FIG. 2 illustrates the second embodiment of the amplifying apparatus as applied to a stand-by circuit. Transistors 52 and 53 are controlled by a command signal from a stand-by command terminal 51, and a switching transistor 54 is controlled by the transistor 52. In other words, the transistors 52 to 54 constitute a stand-by switching circuit; the transistors 52 and 53 are controlled on the basis of a stand-by command signal supplied to the stand-by command terminal 51, with the switching transistor 54 serving to control the supply and cutoff of the power supply voltage $V_{CC}$ supplied to a stand-by line 55. The transistor 53 is connected to a ripple filter line 57 through a resistor 56.

The stand-by circuit is used to reduce power consumption which increases when the voltage $V_{CC}$ is kept supplied. This stand-by circuit controls the transistor 54 based on the command signal input to the stand-by command terminal 51, and cuts off the power from the power supply of the amplifying apparatus as needed to render the amplifying apparatus inoperative.

The differential amplifier stage 30, which constitutes the input section of the amplifying apparatus, is supplied with the power over the stand-by line 55. Since this section is the same as that of the first embodiment shown in FIG. 1, the same reference numerals as shown in FIG. 1 are used to specify the corresponding or identical elements in FIG. 2 and their otherwise redundant description will be omitted. The base of the transistor 41 is supplied with a signal from the collector of the transistor 53.

In the apparatus with such a structure, if the potential of the input signal to the stand-by command terminal 51 falls down to or below a voltage $V_F$ in the forward PN direction of the transistors 52 and 53, those transistors 52 and 53 are turned off to be in the standby state. At this time, the transistor 53, which has cut off the base current of the transistor 41 when the amplifying apparatus is operated, turns on the transistor 41 in the stand-by state and lowers the level of the input signal IN of the transistor 31 in the differential amplifier stage 30. Thereafter, the transistors 42 and 43 are controlled in the same manner as done in the embodiment shown in FIG. 1, and the unbalanced state of the differential amplifier stage 30 is quickly relieved.

The present invention can apply other circuits than those of the aforementioned embodiments. For instance, although the foregoing description of the embodiments has been given with a reference to the amplifier circuit which deals with a low-frequency signal, such as a sound signal, the present invention can also apply to a high frequency amplifier circuit.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An amplifying apparatus with a differential amplifier stage including a pair of transistors respectively supplied with an input signal to be amplified and a negative feedback signal corresponding to an amplified output signal, said apparatus comprising:

power-off detecting means for detecting cutoff of a power supply voltage to be supplied to said differential amplifier stage;

first input control means for inhibiting an input to said differential amplifier stage when a power-off state is detected by said power-off detecting means;

input detecting means, controlled based on an input signal to said differential amplifier stage, for detecting inhibition of said input signal; and second input control means for inhibiting said negative feedback signal to said differential amplifier stage when said input detecting means detects said input signal being inhibited.

2. An apparatus according to claim 1, wherein said power-off detecting means comprises a transistor having a base controlled by a voltage signal acquired by voltage-division of a power supply voltage, said transistor being turned on upon reduction in said power supply voltage.

3. An apparatus according to claim 1, wherein said first input control means comprises an NPN transistor having an emitter connected to a ground circuit and a collector connected to a base of a transistor constituting said differential amplifier stage and having said base supplied with said input signal, said NPN transistor having a base supplies with a signal generated when said power-off detecting means detects a power-off state, so as to be turned on.

4. An apparatus according to claim 1, wherein said input detecting means comprises a PNP transistor having a base connected to a base of a transistor constituting said differential amplifier stage and having said base supplied with said input signal, said PNP transistor having an emitter supplied with said negative feedback signal and a collector from which a signal is output in accordance with a level of said input signal.

5. An apparatus according to claim 1, wherein said second input control means comprises an NPN transistor having an emitter connected to a ground circuit and a collector connected to a base of a transistor constituting said differential amplifier stage and having said base supplied with negative feedback signal, said NPN transistor having a base supplied with a signal to be turned on when said input detecting means detects said input signal being inhibited.

6. An apparatus according to claim 1, wherein said input signal to said differential amplifier stage is a sound signal.

7. An apparatus according to claim 1, wherein said power supply voltage is supplied through a switching transistor to said differential amplifier stage, and said switching transistor is controlled by a transistor which is controlled by a stand-by command signal to thereby cut off power supply to said differential amplifier stage.

8. An apparatus according to claim 7, which further comprises a transistor having a base controlled together with said transistor controlled by said stand-by command signal, and in which said first input control means is controlled by an output signal supplied from said base-controlled transistor to inhibit the input to said differential amplifier stage in a stand-by state.

9. An amplifying apparatus with a differential amplifier stage including a first transistor having a base supplied with an input signal and a second transistor having a base supplied with an output signal as a negative feedback signal, said apparatus comprising:

a third transistor for outputting a signal for detecting a disabled state of a signal amplifier section including said differential amplifier stage;

a fourth transistor of an NPN type, which is turned on based on a disabled-state detection signal from said third transistor, said fourth transistor having a collector connected to said case of said first transistor of said differential amplifier stage and an emitter grounded;

a fifth transistor of a PNP type having a base connected to said base of said first transistor and an emitter connected to said base of said second transistor of said differential amplifier stage; and a sixth transistor of an NPN type having a base connected to a collector of said fifth transistor, a collector connected to said base of said second transistor and an emitter grounded.

* * * * *